(12) United States Patent
Yang et al.

(10) Patent No.: US 12,211,788 B2
(45) Date of Patent: *Jan. 28, 2025

(54) HYBRID INTERCONNECT STRUCTURE FOR SELF ALIGNED VIA

(71) Applicant: Taiwan Semiconductor Manufacturing Company, Ltd., Hsin-Chu (TW)

(72) Inventors: Shin-Yi Yang, New Taipei (TW); Ming-Han Lee, Taipei (TW); Shau-Lin Shue, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/340,079

(22) Filed: Jun. 23, 2023

(65) Prior Publication Data

US 2023/0335486 A1 Oct. 19, 2023

Related U.S. Application Data

(60) Continuation of application No. 17/843,191, filed on Jun. 17, 2022, now Pat. No. 11,728,264, which is a (Continued)

(51) Int. Cl.
*H01L 23/522* (2006.01)
*H01L 21/768* (2006.01)

(52) U.S. Cl.
CPC .... *H01L 23/5226* (2013.01); *H01L 21/76807* (2013.01); *H01L 21/76877* (2013.01)

(58) Field of Classification Search
CPC .......... H01L 23/5226; H01L 21/76877; H01L 21/76802; H01L 21/76822; H01L 21/76847; H01L 21/76849
See application file for complete search history.

(56) References Cited

U.S. PATENT DOCUMENTS 6,759,332 B2 7/2004 Clevenger et al.
8,525,339 B2 9/2013 Yang et al.
(Continued)

OTHER PUBLICATIONS

Non-Final Office Action dated Sep. 30, 2021 for U.S. Appl. No. 16/884,480.
(Continued)

*Primary Examiner* — Bac H Au
(74) *Attorney, Agent, or Firm* — Eschweiler & Potashnik, LLC

(57) ABSTRACT

An interconnect structure is provided. The interconnect structure includes a first metal line. The first metal line includes a first conductive material disposed within a first dielectric layer over a substrate and a second conductive material disposed within the first dielectric layer and directly over a top of the first conductive material. The second conductive material is different from the first conductive material. A second dielectric layer is disposed over the first dielectric layer. A first via comprising a third conductive material is disposed within the second dielectric layer and on a top of the second conductive material. The second conductive material and the third conductive material have lower diffusion coefficients than the first conductive material.

20 Claims, 17 Drawing Sheets

Related U.S. Application Data division of application No. 16/884,480, filed on May 27, 2020, now Pat. No. 11,404,366.

(56) References Cited

U.S. PATENT DOCUMENTS

| | | | |
|---|---|---|---|
| 9,153,483 | B2 | 10/2015 | Shieh et al. |
| 9,633,941 | B2 | 4/2017 | Lin et al. |
| 9,748,173 | B1 | 8/2017 | Murray et al. |
| 2007/0155165 | A1 | 7/2007 | Park et al. |
| 2009/0238958 | A1 | 9/2009 | Sinha |
| 2014/0021614 | A1 | 1/2014 | Yu et al. |
| 2015/0235963 | A1* | 8/2015 | Lin ................... H01L 23/53238 257/774 |
| 2015/0270215 | A1 | 9/2015 | Peng et al. |
| 2015/0364371 | A1 | 12/2015 | Yen et al. |
| 2016/0005691 | A1 | 1/2016 | Liu et al. |
| 2016/0049330 | A1 | 2/2016 | Peng |
| 2016/0111371 | A1 | 4/2016 | Peng et al. |
| 2017/0213791 | A1 | 7/2017 | Cheng et al. |
| 2018/0076132 | A1 | 3/2018 | Tsai et al. |
| 2018/0090439 | A1* | 3/2018 | Liu ................... H01L 21/76802 |
| 2018/0174961 | A1* | 6/2018 | Ting ................... H01L 21/7682 |
| 2020/0006127 | A1 | 1/2020 | Khaderbad et al. |
| 2020/0020745 | A1* | 1/2020 | Chen ................... H10N 70/8833 |
| 2020/0098685 | A1 | 3/2020 | Lee et al. |
| 2020/0144178 | A1* | 5/2020 | Patlolla ............... H01L 23/5329 |
| 2021/0217699 | A1 | 7/2021 | Zhu et al. |
| 2021/0225762 | A1 | 7/2021 | Mrunal Abhijith et al. |

OTHER PUBLICATIONS

Notice of Allowance dated Mar. 31, 2022 for U.S. Appl. No. 16/884,480.

Notice of Allowance dated Mar. 31, 2023 for U.S. Appl. No. 17/843,191.

* cited by examiner

HYBRID INTERCONNECT STRUCTURE FOR SELF ALIGNED VIA

REFERENCE TO RELATED APPLICATIONS

This Application is a Continuation of U.S. application Ser. No. 17/843,191, filed on Jun. 17, 2022, which is a Divisional of U.S. application Ser. No. 16/884,480, filed on May 27, 2020 (now U.S. Pat. No. 11,404,366, issued on Aug. 2, 2022). The contents of the above-referenced Patent Applications are hereby incorporated by reference in their entirety.

BACKGROUND

Modern day integrated chips contain millions of semiconductor devices. The semiconductor devices are electrically interconnected by way of back-end-of-the-line (BEOL) metal interconnect layers that are formed above the devices on an integrated chip. A typical integrated chip comprises a plurality of back-end-of-the-line metal interconnect layers including different sized metal wires vertically coupled together with metal contacts (i.e., vias).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
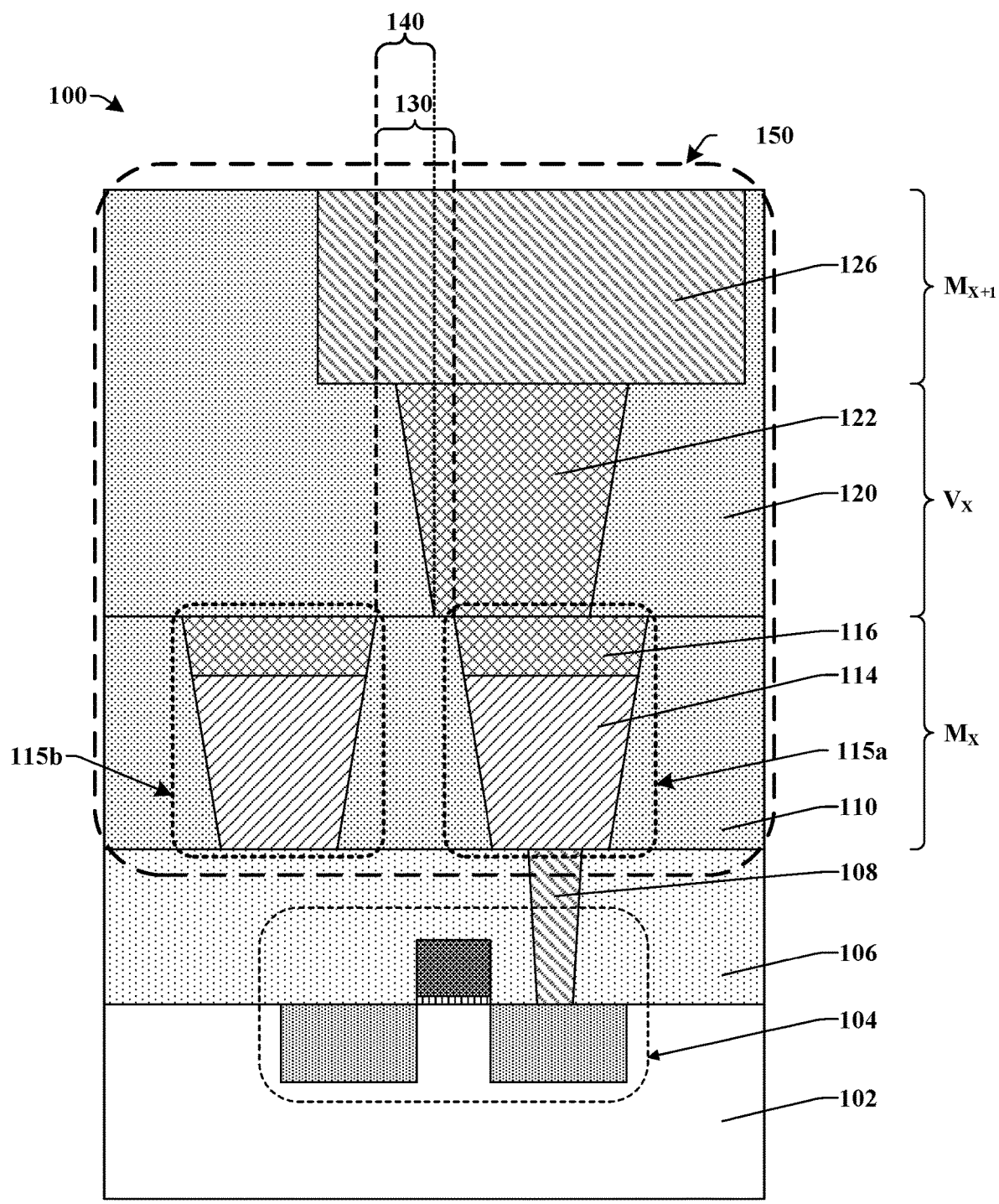
FIGS. 1-2 illustrate cross-sectional views of some embodiments of an integrated chip comprising a hybrid interconnect structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many modern integrated chips include interconnect structures disposed over a substrate. An interconnect structure may include a plurality of metal wire layers vertically separated by via layers and laterally surrounded by interlayer dielectric (ILD) layers. For example, an interconnect structure may include a first metal wire layer having a first plurality of metal lines separated by a first ILD layer, a first plurality of vias over the first plurality of metal lines and laterally separated by a second ILD layer, and a second metal wire layer comprising a second plurality of metal lines over the first plurality of vias and laterally separated by a third ILD layer.

During integrated chip development, interconnect structures are typically tested to ensure that they are sufficiently resistant to time dependent dielectric breakdown (TDDB). TDDB occurs when an ILD material breaks down between adjacent metal lines and/or vias and allows for a conductive path to extend between the adjacent metal lines and/or vias. The breakdown may be due to damage of the ILD material (e.g., due to electric fields generated by the metal lines and/or vias) and/or due to a diffusion of metal atoms (e.g., copper atoms) from the metal lines and/or vias into the ILD material.

As the size of components within integrated chips decrease, a distance between neighboring metal lines and/or neighboring vias also decreases. Small distances between neighboring metal lines and/or vias increase a chance of an intervening ILD layer undergoing TDDB, and of a leakage current occurring between the neighboring metal lines and/or vias. This leakage current may create unwanted short circuits between the neighboring metal lines and/or vias that are designed to be electrically isolated from one another, thus reducing the reliability of the integrated chip.

Various embodiments of the present disclosure relate to an integrated chip comprising a hybrid interconnect structure for improving the reliability of the integrated chip and a method for forming the hybrid interconnect structure. The hybrid interconnect structure may comprise a first plurality of metal lines laterally spaced apart by a first interlayer dielectric (ILD) layer. The first plurality of metal lines may respectively comprise a first conductive material and a second conductive material. The second conductive material is different from the first conductive material and is directly over a top of the first conductive material. The hybrid interconnect structure may further comprise a plurality of vias laterally spaced apart by a second ILD layer and disposed over the first plurality of metal lines. Vias of the plurality of vias may comprise the second conductive material. In some embodiments, the second conductive material comprises a greater resistance to diffusion than the first conductive material, thereby mitigating diffusion of material from the first plurality of metal lines and/or the plurality of vias into the first and/or second ILD layers. As a result, the integrated chip can perform more reliably without increasing the distance between neighboring metal lines and/or neighboring vias.

FIG. 1 illustrates a cross-sectional view of some embodiments of an integrated chip 100 comprising a hybrid interconnect structure 150. The integrated chip 100 comprises a semiconductor device 104 and an insulating layer 106 over a substrate 102. The hybrid interconnect structure 150 is disposed over the substrate 102. A contact 108 may electrically couple the semiconductor device 104 to the hybrid interconnect structure 150. The hybrid interconnect structure 150 comprises a first metal wire layer $M_X$, a first via layer $V_X$ over the first metal wire layer $M_X$, and a second metal wire layer $M_{X+1}$ over the first via layer $V_X$.

The first metal wire layer $M_X$ comprises a first metal line 115a and a second metal line 115b laterally spaced apart from the first metal line 115a by a first dielectric layer 110 (e.g., an interlayer dielectric layer). The first metal line 115a and the second metal line 115b may respectively comprise a first conductive material 114 and a second conductive material 116 over a top of the first conductive material 114. In some embodiments, the first metal line 115a is laterally separated form the second metal line 115b by a first distance 130. In some embodiments, the first conductive material 114 comprises a first metal and the second conductive material 116 comprises a second metal different from the first metal.

The first via layer $V_X$ comprises a first via 122 over a top of the first metal line 115a. The first via 122 may comprise the second conductive material (e.g., the second metal) and may be disposed within a second dielectric layer 120. In some embodiments, the first via 122 is offset from the first metal line 115a such that a second distance 140 exists between a sidewall of the first via 122 and a sidewall of the second metal line 115b. The second distance 140 may exist due to a misalignment in the forming of the first via 122, and may be smaller than the first distance 130. Because the first via 122 is offset from the first metal line 115a in the direction of the second metal line 115b, a potential for a leakage current to occur between the first via 122 and the second metal line 115b is increased. The second metal layer $M_{X+1}$ comprises a third metal line 126 over a top of the first via 122 and within the second dielectric layer 120. The third metal line 126 may comprise the first conductive material (e.g., the first metal).

In some embodiments, the second conductive material comprises a greater resistance to diffusion than the first conductive material. For example, in some embodiments, the second conductive material may have a smaller diffusion coefficient in a dielectric than the first conductive material. In some embodiments, the first conductive material may comprise copper, cobalt, or the like. In some embodiments, the second conductive material may comprise a refractory metal, such as tungsten, molybdenum, tantalum, ruthenium, or the like.

Having the second conductive material along a bottom of the first via 122 can reduce diffusion of metal into the first dielectric layer 110 and/or the second dielectric layer 120 at a smallest distance (e.g., second distance 140) between adjacent metal interconnects (e.g., between the first via 122 and the second metal line 115b) and therefore decreases TDDB. By decreasing TDDB, the second conductive material reduces the potential for the leakage current to occur between the first via 122 and the second metal line 115b, thus increasing the reliability of the integrated chip 100. As a result, the integrated chip 100 can perform more reliably without having to increase the first distance 130 between the first via 122 and the second metal line 115b. Furthermore, because the first via 122 comprises the second conductive material, the first via 122 does not require a barrier layer to prevent diffusion and thereby reduces a resistance of the first via 122 and further improves performance of the integrated chip 100.

Figure 2:
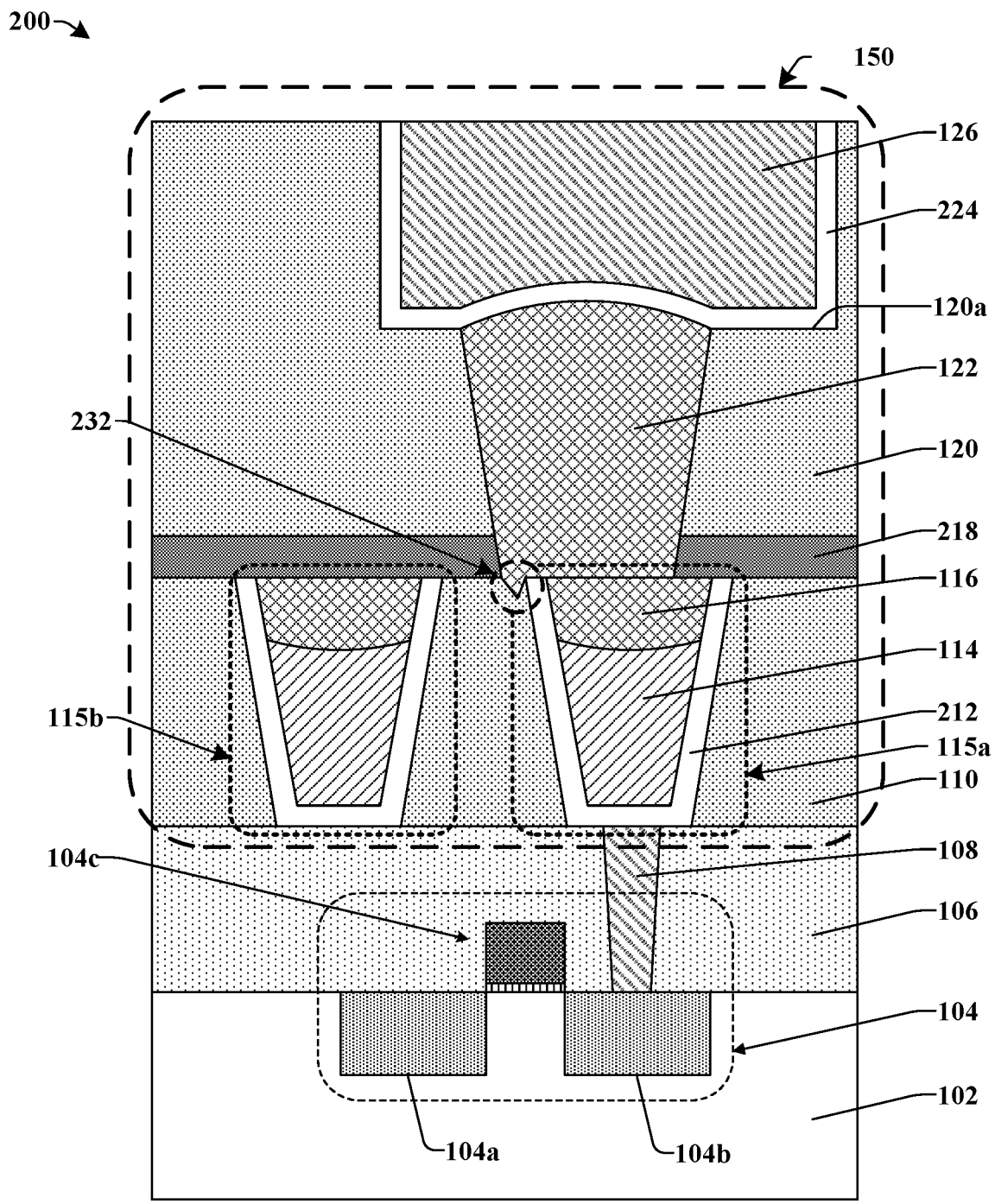

FIG. 2 illustrates a cross-sectional view of some embodiments of an integrated chip 200 comprising a hybrid interconnect structure 150. The integrated chip 200 comprises the substrate 102, the semiconductor device 104 over the substrate 102, the insulating layer 106 over the semiconductor device 104, and the contact 108 disposed within the insulating layer 106 and configured to connect the semiconductor device 104 to the hybrid interconnect structure 150.

In some embodiments, the substrate 102 may comprise silicon, germanium, any III-V compound, or any combination of the foregoing. In some embodiments, the semiconductor device 104 may comprise a MOSFET device. In such embodiments, the semiconductor device 104 may comprise a source region 104a disposed within the substrate 102, a drain region 104b disposed within the substrate 102, and a gate structure 104c disposed over the substrate 102 between the source region 104a and the drain region 104b. In other embodiments, the semiconductor device 104 may comprise, a junction-field effect transistor (JFET), a bi-polar junction transistor (BJT), or the like. The insulating layer 106 may comprise silicon dioxide, silicon nitride, a low-K dielectric, or any combination of the foregoing. The contact 108 may comprise tungsten, cobalt, or any other suitable metal.

In some embodiments, the first metal line 115a and the second metal line 115b comprise a first barrier layer 212 that laterally separates the first conductive material 114 and the second conductive material 116 from the first dielectric layer 110. In some embodiments, the first barrier layer 212 laterally contacts sides of both the first conductive material 114 and the second conductive material 116. In some embodiments, the first barrier layer 212 may continuously extend from a sidewall of the first conductive material 114 to an upper surface of the second conductive material 116.

The first barrier layer 212 may comprise, for example, cobalt tantalum, cobalt ruthenium, cobalt titanium, ruthenium cobalt, ruthenium tantalum, tantalum nitride, titanium nitride, aluminum oxide, titanium oxide, tantalum oxide, zirconium oxide, another metal alloy, another metal nitride, another metal oxide, or any combination of the foregoing. The first conductive material 114 may comprise, for example, copper, cobalt, any other suitable metal, or any combination of the foregoing. The second conductive material 116 may comprise, for example, tungsten, molybdenum, tantalum, ruthenium, any other refractory metal, or any combination of the foregoing. The first dielectric layer 110 may comprise, for example, silicon oxide, silicon nitride, a low-k dielectric material, or any combination of the foregoing. In some embodiments, a height of the first conductive material 114 is about 50 to 500 angstroms. In some embodiments, a height of the second conductive material 116 is about 10 to 100 angstroms. In some embodiments, the first metal line 115a and the second metal line 115b may comprise vertical or angled sidewalls.

In some embodiments, the first conductive material 114 may comprise a curved upper surface. The curved upper surface of the first conductive material 114 may be a result of etching the first conductive material 114. In some such embodiments, the second conductive material 116 may comprise a curved lower surface. The curved lower surface of the second conductive material 116 may be a result of forming the second conductive material 116 over the curved upper surface of the first conductive material 114. In some embodiments (not shown), an alloy comprising atoms from both the first conductive material and the second conductive materials may exist at an interface between the first conductive material 114 and the second conductive material 116 due to a diffusion of atoms between the two conductive materials.

In some embodiments, an etch stop layer 218 is disposed over the first dielectric layer 110. The etch stop layer 218 comprises sidewalls that define an opening over the second conductive material 116. In some embodiments, the etch stop layer 218 may comprise a first sidewall disposed over the second conductive material 116 and a second sidewall disposed over the first dielectric layer 110. The etch stop layer 218 may comprise, for example, silicon nitride, silicon carbide, or any combination of the foregoing.

In some embodiments, the second dielectric layer 120 is disposed over the etch stop layer 218. The second dielectric layer 120 comprises sidewalls that define a via opening and that further define a trench opening. The first via 122 is disposed within the via opening and the third metal line 126 is disposed within the trench opening. In some embodiments (not shown), the second conductive material may extend from within the via opening to over an upper surface 120a of the second dielectric layer 120. In such embodiments, the first via 122 comprises the second conductive material, the third metal line 126 comprises the first and second conductive materials, and the first conductive material vertically separates the second conductive material from the upper surface 120a of the second dielectric layer 120. In other embodiments (not shown), the second conductive material may be recessed below a top of the via opening, so that the second conductive material is recessed below the upper surface 120a by a non-zero distance. In such embodiments, the first conductive material may extend from over the upper surface 120a to within the via opening. The second dielectric layer 120 may comprise, for example, silicon oxide, silicon nitride, a low-k dielectric, or any combination of the foregoing.

In some embodiments, the first via 122 comprises a first over-etch region 232. The first over-etch region 232 may be a result of an offset of the first via 122 from the first metal line 115a. The first over-etch region 232 may shorten a distance between the first via 122 and the second metal line 115b, thus increasing a potential for a leakage current to occur between the two.

In some embodiments, a top of the first via 122 may be curved. The curved top of the first via 122 may be a result of a process used to form the first via 122. In some embodiments, a height of the first via is about 50 to 500 angstroms. The first via may 122 may comprise vertical or angled sidewalls.

In some embodiments, a second barrier layer 224 may laterally separate the third metal line 126 from the second dielectric layer 120 and vertically separate the third metal line 126 from the first via 122. In some such embodiments, the first via 122 is not separated from the second dielectric layer 120 by a barrier layer, so that the first via 122 directly contacts the second dielectric layer 120. Because the first via 122 comprises the second conductive material, a diffusion of material from the first via is relatively low and therefore a barrier layer is not needed. By not surrounding the first via 122 with a barrier layer, a resistance of the first via 122 can be decreased thereby improving a performance of the integrated chip 200. In some embodiments, a top of the first via 122 may be disposed above a lowermost surface of the second barrier layer 224. The second barrier layer 224 may comprise a flat or uneven lower surface as a result of being formed over the top of the first via 122. The second barrier layer 224 may comprise, for example, cobalt tantalum, cobalt ruthenium, cobalt titanium, ruthenium cobalt, ruthe-nium tantalum, tantalum nitride, titanium nitride, aluminum oxide, titanium oxide, tantalum oxide, zirconium oxide, another metal alloy, another metal nitride, another metal oxide, or any combination of the foregoing.

Although the first via 122 is described as having a same second conductive material as the first metal line 115a and the second metal line 115b, it will be appreciated that in some embodiments the first via 122 may comprise a third conductive material that is different than the second conductive material within the first metal line 115a and the second metal line 115b. In such embodiments, the second conductive material and the third conductive material both have a higher resistance to diffusion (e.g., a lower diffusion coefficient) than the first conductive material. For example, in some embodiments, the first metal line 115a may comprise a first refractory metal disposed over the first conductive material and the first via 122 may comprise a second refractory metal that is different than the first refractory metal. Similarly, although the third metal line 126 is described as having a same first conductive material as the first metal line 115a and the second metal line 115b, it will be appreciated that the third metal line 126 may comprise a fourth conductive material that is different than the first conductive material within the first metal line 115a and the second metal line 115b.

Figure 3:
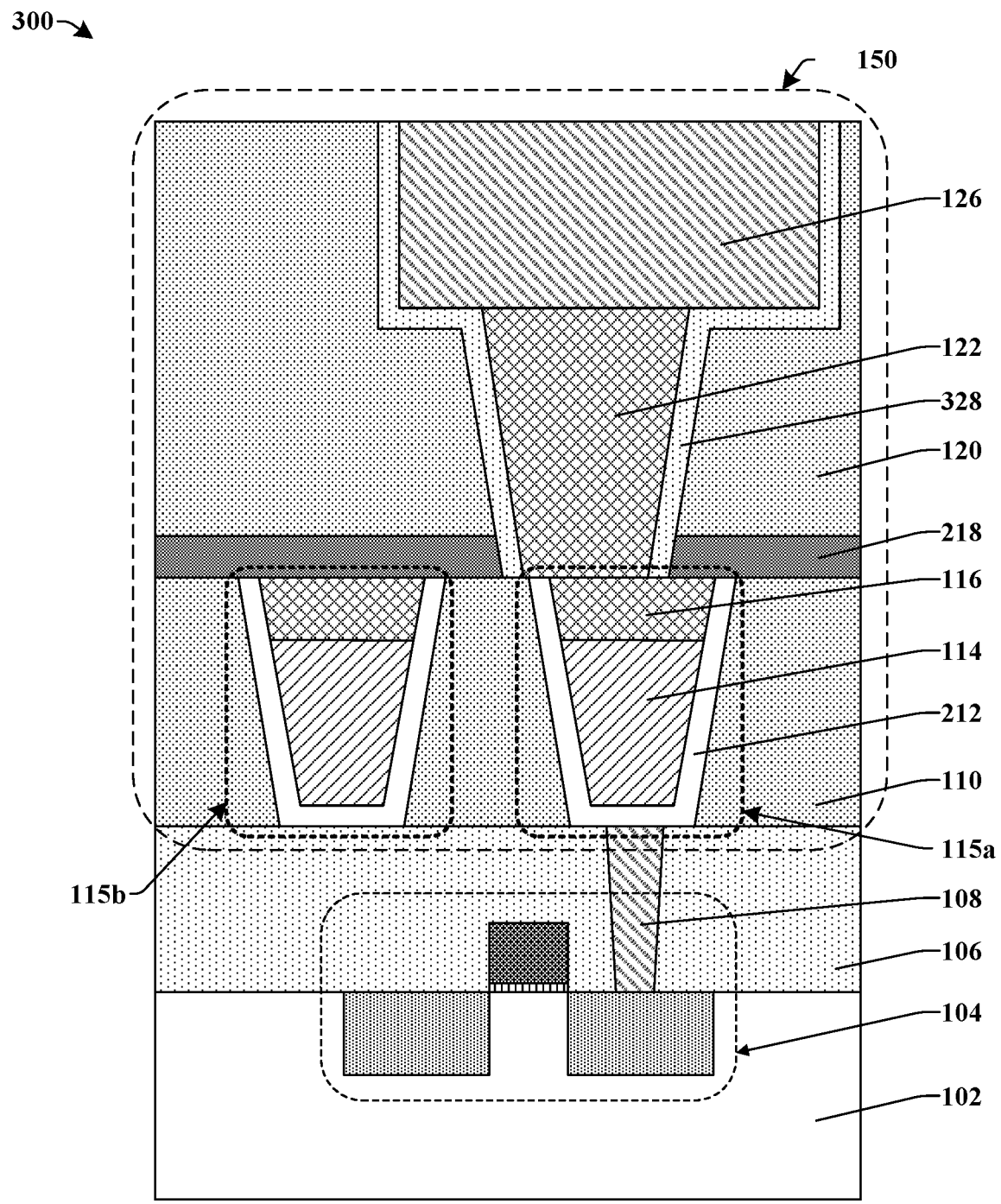
FIG. 3 illustrates a cross-sectional view of some additional embodiments of an integrated chip comprising a hybrid interconnect structure with a plurality of barrier layers.

FIG. 3 illustrates a cross-sectional view of some additional embodiments of an integrated chip 300 comprising a hybrid interconnect structure 150 with a first barrier layer 212 and a second barrier layer 328. The first barrier layer 212 surrounds the first metal line 115a and the second metal line 115b. The second barrier layer 328 may be disposed along sidewalls of the first via 122 such that the second barrier layer 328 laterally separates the first via 122 from the second dielectric layer 120. The second barrier layer 328 may further be disposed along sidewalls and a lower surface of the third metal line 126 such that the second barrier layer 328 laterally separates the third metal line 126 from the second dielectric layer 120 and vertically separates the third metal line 126 from the second dielectric layer 120. The second barrier layer 328 may further reduce the potential for a leakage current to occur between the first via 122 and the second metal line 115b. In some embodiments, the second barrier layer 328 may have interior sidewalls that define an opening that is over the first via 122. In such embodiments, the second barrier layer 328 does not cover a part of a top of the first via 122.

The second barrier layer 328 may comprise, for example, cobalt tantalum, cobalt ruthenium, cobalt titanium, ruthenium cobalt, ruthenium tantalum, tantalum nitride, titanium nitride, aluminum oxide, titanium oxide, tantalum oxide, zirconium oxide, another metal alloy, another metal nitride, another metal oxide, or any combination of the foregoing. In some embodiments, the first barrier layer 212 may comprise a different material than the second barrier layer 328. A thickness of the second barrier layer 328 may be about 5 to 30 angstroms.

FIGS. 4-16C illustrate cross-sectional views 400-1620 of some embodiments of a method for forming an integrated chip comprising a hybrid interconnect structure. Although FIGS. 4-16C are described in relation to a method, it will be appreciated that the structures disclosed in FIGS. 4-16C are not limited to such a method, but instead may stand alone as structures independent of the method.

Figure 4:
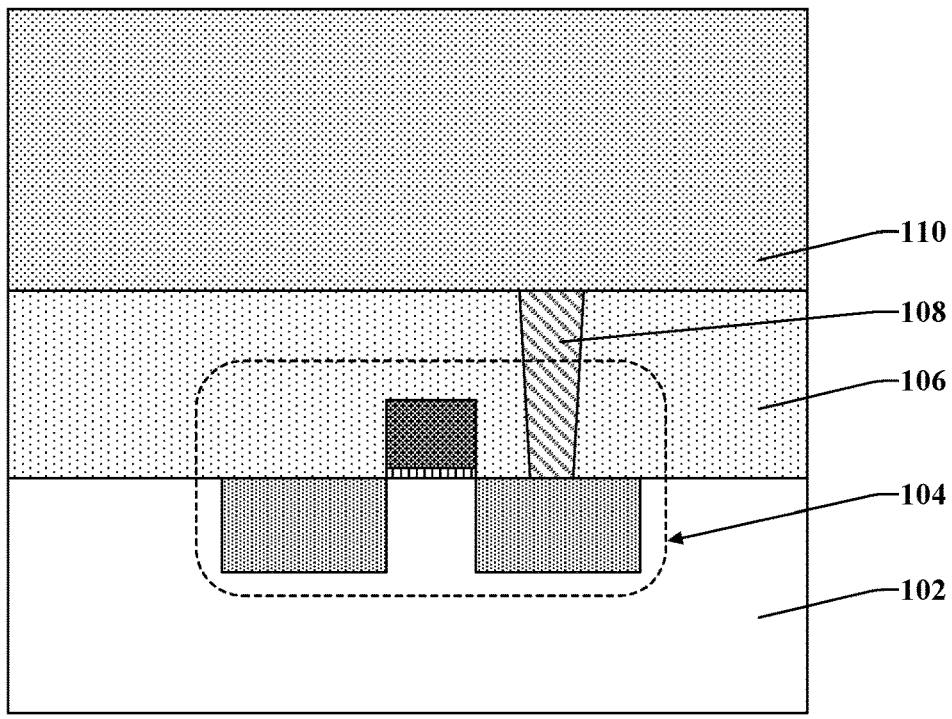
FIGS. 4-14, 15A-15C, 16A-16C illustrate cross-sectional views of some embodiments of a method for forming an integrated chip comprising a hybrid interconnect structure.

As shown in cross-sectional view 400 of FIG. 4, the first dielectric layer 110 is formed over the substrate 102. The first dielectric layer 110 may be formed by chemical vapor deposition (CVD), atomic layer deposition (ALD), or any other suitable process.

Figure 5:
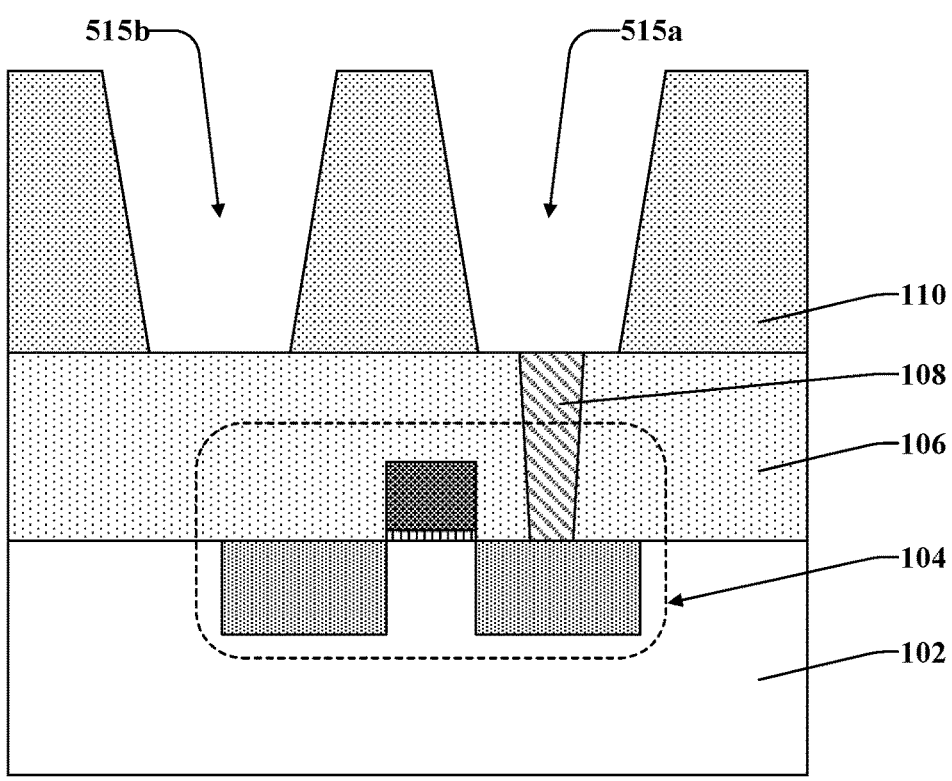

As shown in cross-sectional view 500 of FIG. 5, a first etch may be performed into the first dielectric layer 110 to form a first trench opening 515a and a second trench opening 515b adjacent to the first trench opening 515a and laterally spaced apart from the first trench opening 515a by the first dielectric layer 110. The first etch may comprise a wet etching process or a dry etching process. The first trench opening 515a and the second trench opening 515b may comprise vertical sidewalls or angled sidewalls.

Figure 6:
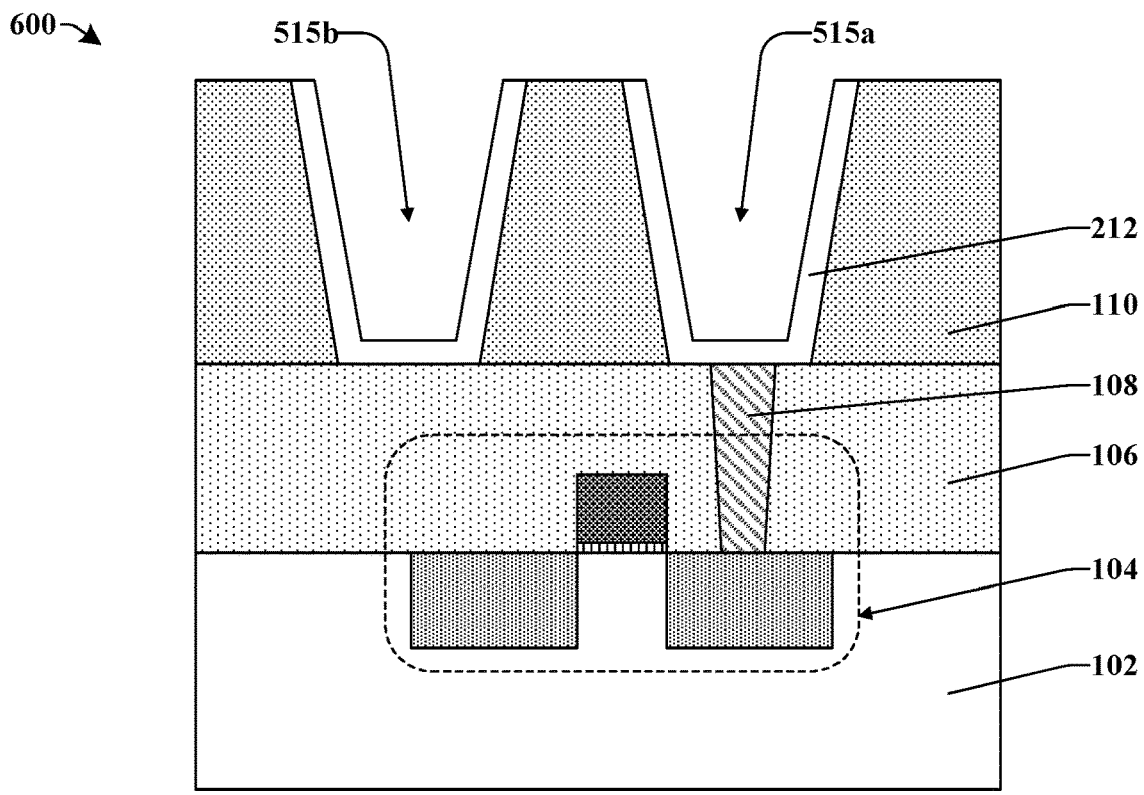

As shown in cross-sectional view 600 of FIG. 6, the first barrier layer 212 may be formed over the substrate 102, along sidewalls of the first dielectric layer 110, in the first trench opening 515a, and in the second trench opening 515b. The first barrier layer 212 may be formed by CVD, ALD, or the like.

Figure 7:
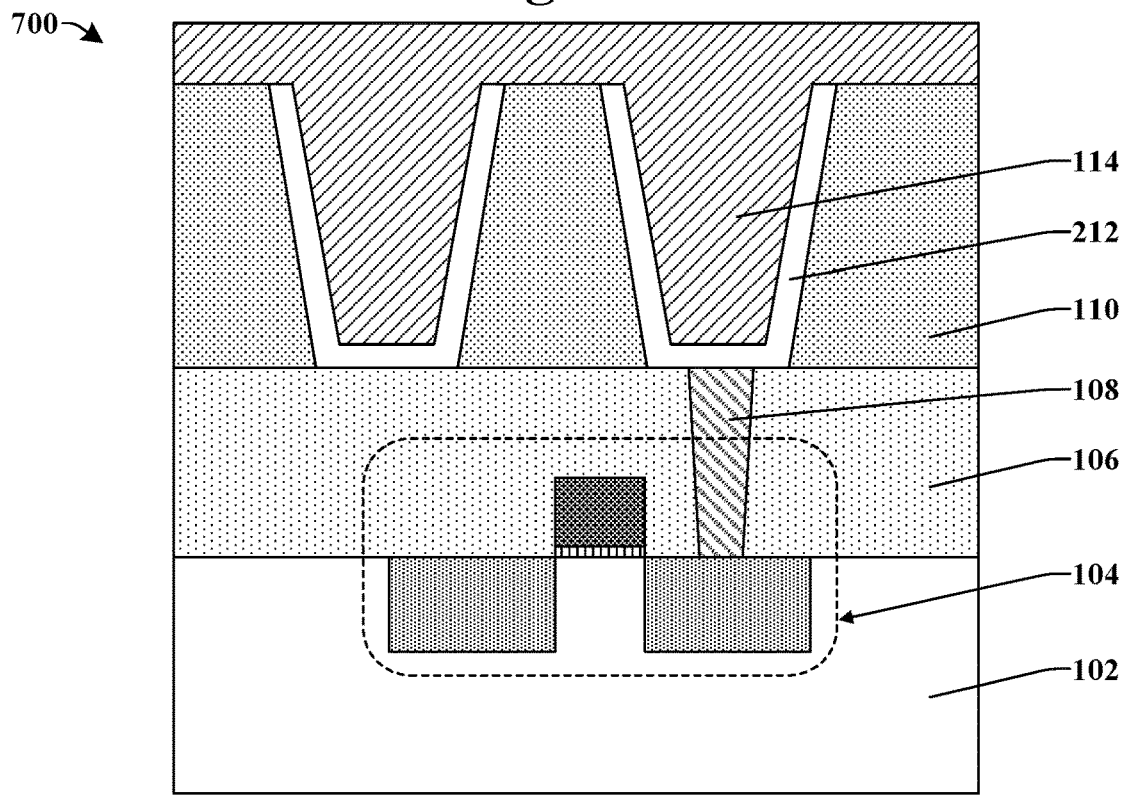

As shown in cross-sectional view 700 of FIG. 7, the first conductive material 114 comprising a first metal may be formed in the first trench opening 515a and in the second trench opening 515b. A portion of the first conductive material 114 may be disposed over the first dielectric layer 110 after forming the first conductive material 114. The first conductive material 114 may be formed by CVD, ALD, electrochemical deposition (ECP), electroless deposition (ELD), or the like.

Figure 8:
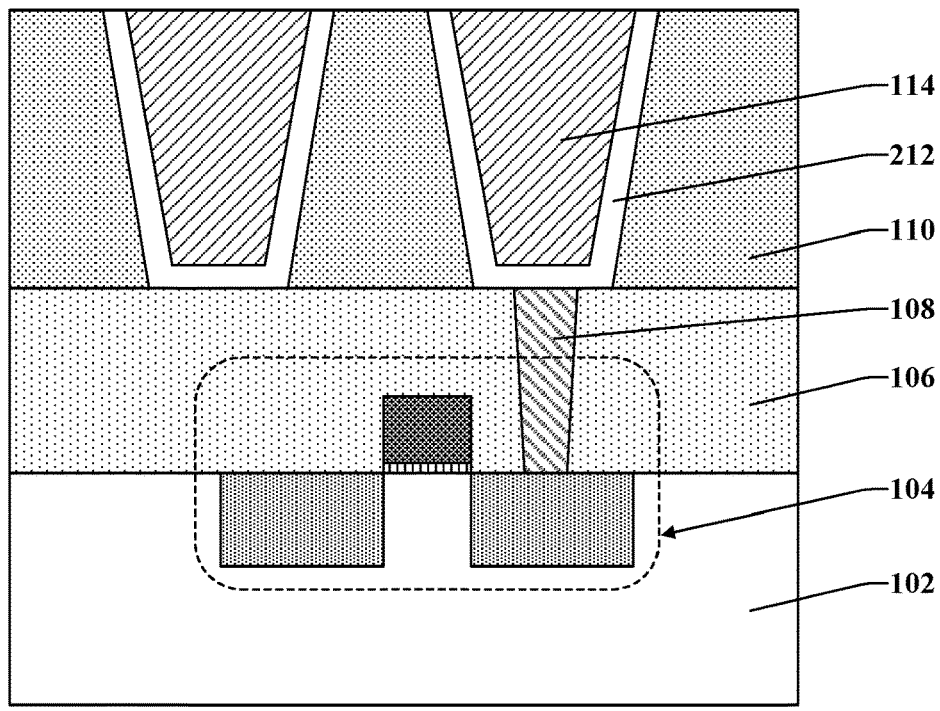

As shown in cross-sectional view 800 of FIG. 8, in some embodiments, the first conductive material 114 may be planarized such that the top of the first conductive material 114 may be aligned with a top of the first dielectric layer 110. The planarization may remove the portion of the first conductive material that was disposed over the first dielectric layer 110. The planarization may comprise a chemical-mechanical planarization (CMP) process. In other embodiments, the first conductive material 114 may not be planarized.

Figure 9:
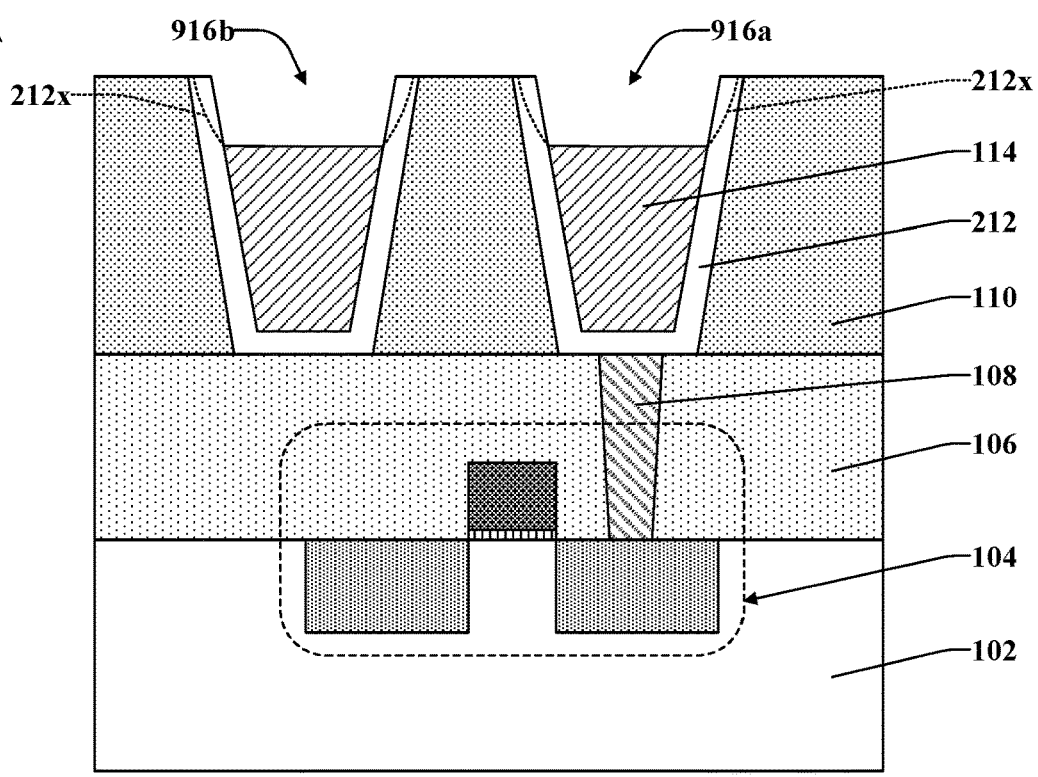

As shown in cross-sectional view 900 of FIG. 9, a second etch is performed into the first conductive material 114 to recess the first conductive material 114 below a top of the first dielectric layer 110. In some embodiments, the second etch may recess the first conductive material 114 to a distance in a range of between approximately 10 angstroms and approximately 100 angstroms below the top of the first dielectric layer 110, in a range of between approximately 10 angstroms and approximately 50 angstroms below the top of the first dielectric layer 110, or in other ranges having similar values. By recessing the first conductive material 114, a resistance of a subsequently formed interconnect layer that comprises the first conductive material 114 is improved (since the first conductive material 114 may have a worse electrical resistance than a subsequently formed metal (e.g., 116 of FIG. 10)). In some embodiments, recessing the first conductive material 114 to a depth of greater than 10 angstroms will ensure that the first conductive material 114 is present at a top of the first dielectric layer 110 where diffusion of metal atoms is likely to occur, thereby mitigating dielectric breakdown between adjacent interconnect structures. In some embodiments, recessing the first conductive material to a depth of less than 100 angstroms will provide for interconnect structures having a good electrical performance.

Recessing the first conductive material 114 forms a first opening 916a and a second opening 916b over the first conductive material 114. The first opening 916a and the second opening 916b may be laterally spaced apart by any of the first dielectric layer 110 and the first barrier layer 212.

In some embodiments, a portion of the first barrier layer 212 may be removed during the second etch. In some such embodiments, the first barrier layer 212 may comprise thinned sidewalls and/or curved sidewalls, as illustrated by dashed lines 212x in FIG. 9. In other such embodiments, the first barrier layer 212 may be recessed to have a top surface that is below a top surface of the first dielectric layer 110 by a non-zero distance.

The second etch may comprise a wet etching process or a dry etching process. In various embodiments, the wet etching process may include a wet etchant comprising hydrofluoric acid, potassium hydroxide, phosphoric acid, acetate, hydrogen peroxide, potassium perchlorate, or the like. In various embodiments, the dry etching process may comprise a reactive ion etching (RIE) process, an ion bombardment etching process, an ion beam etching (IBE) process, an ion milling process, an inductively coupled plasma (ICP) process, an ICP-RIE process, or the like. In various embodiments, the dry etching process may use a dry etchant having an etching chemistry comprising fluorine, chlorine, helium, neon, argon, krypton, xenon, or the like.

For example, the IBE process may utilize an applied power of about 100 to 2000 watts, a beam angle relative to the substrate of about 0 to 70 degrees, and any of He, Ne, Ar, Kr, Xe, some other gas, or the like. The ICP-RIE process may utilize an applied power of about 100 to 1500 watts, a voltage bias of about 0 to 500 volts, and any of $CH_3COOH$, $CH_3OH$, $CH_3CH_2OH$, some organic gas, $CF_4CHF_3$, $CH_3F$, $CH_2F_2$, $C_4F_6$, $N_2$, $O_2$, Ar, or the like. The RIE process may utilize an applied power of 100 to 2000 watts, a voltage bias of about 0 to 500 volts, and any of $Cl_2$, $SiCl_4$, $BCl_3$, $CF_4$, $CHF_3$, $CH_3F$, $CH_2F_2$, $C_4F_8$, $C_4F_6$, $N_2$, $O_2$, Ar, or the like.

Further, any of Tolunitrile, 4-Methyl-3-nitrobenzonitrile, 4-(Bromomethyl)benzonitrile. 4-(Chloromethyl)benzonitrile, 2-Fluoro-4-(trifluoromethyl)benzonitrile, 4-(Trifluoromethyl)benzonitrile, Diethylene glycol monobutyl ether, 2-(2-Butoxyethoxy)ethyl acetate, Diethylene glycol dimethyl ether, Dimethyl sulfoxide, Dimethylformamide, Poly(ethylene glycol)bis(amine), (2-Methylbutyl)amine, Tris(2-ethylhexyl)amine, (4-Isothiocyanatophenyl)(3-methylphenyl)amine, Poly(ethylene glycol) methyl ether amine, Poly(ethylene glycol) diamine, Triethanolamine hydrochloride, Triethanolamine, Trolamine, Trolamine salicylate, 2-Chloroethyl vinyl ether, 2-[4-(Dimethylamino)phenyl]ethanol, Tetraethylethylenediamine, Ammonium acetate, Ammonium chloride, Ammonium sulfate, Ammonium formate, Ammonium nitrate, Ammonium carbonate, Ammonium fluoride, Ammonium Persulphate, Ammonium sulfamate, Ammonium phosphate, 1-Acetylguanidine, or the like may be utilized in the wet etching process for cleaning the etching surface before and/or after the wet etchant is applied. In addition, any of 1-Chlorobenzotriazole, 5-Chlorobenzotriazole, 5-Methyl-1H-benzotriazole, 1-methyl-1H-1,2,3-benzotriazole-5-carbaldehyde, 1-Methyl-1H-1,2,3-benzotriazol-5-amine, 1-Methylimidazole, 2-Mercapto-1-methylimidazole, 1-Methylimidazole-2-sulfonyl chloride, 5-Chloro-1-methylimidazole, 5-Iodo-1-methylimidazole, Thiamazole, 1-Methylimidazolium chloride, 2,5-Dibromo-1-methyl-1H-imidazole, 1H-Benzotriazole-4-sulfonic acid, or the like may be utilized in the wet etching process to protect the first barrier layer 212 or another layer of the integrated chip during the wet etching process.

Figure 10:
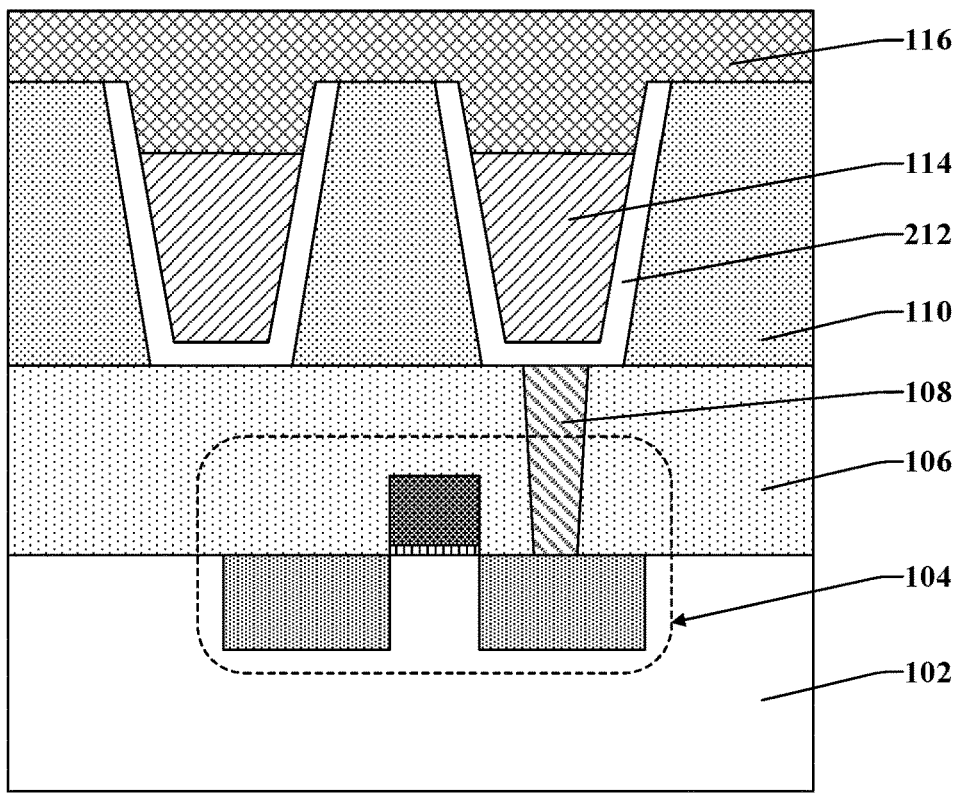

As shown in cross-sectional view 1000 of FIG. 10, a second conductive material 116 comprising a second metal may be formed in the first opening 916a and the second opening 916b. The second conductive material 116 may be formed over a top of the first conductive material 114. A portion of the second conductive material 116 may be disposed over the first dielectric layer 110 after forming the second conductive material 116. The second conductive material 116 may be formed by CVD, ALD, physical vapor deposition (PVD), ECP, ELD, or the like.

Figure 11:
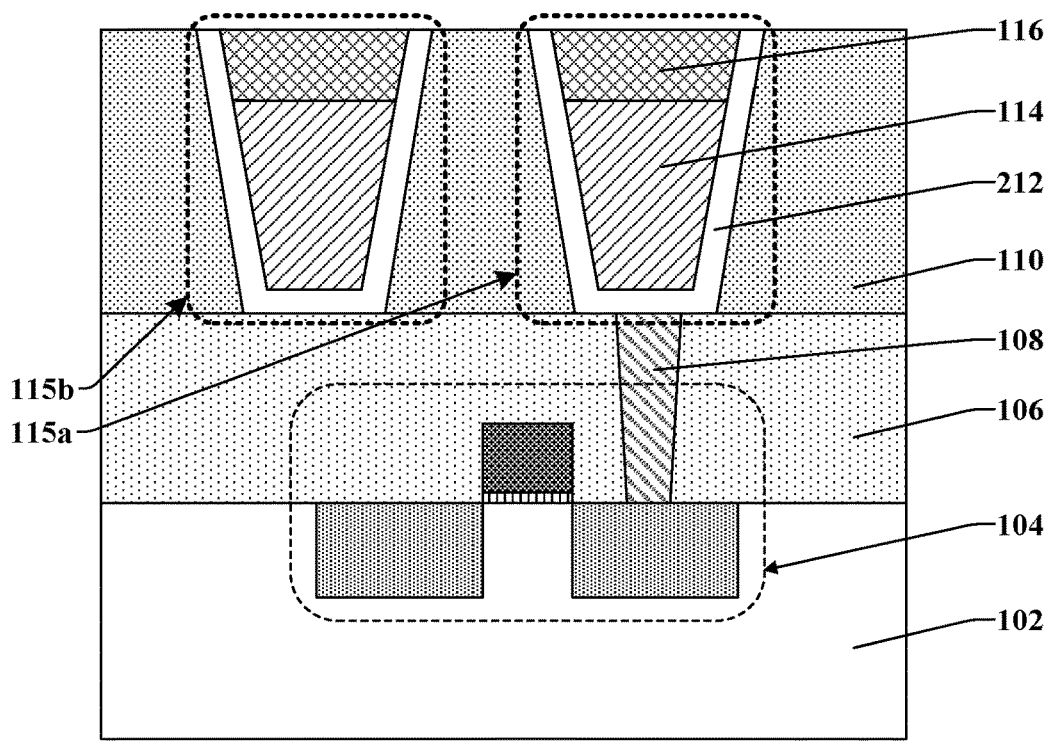

As shown in cross-sectional view 1100 of FIG. 11, the second conductive material 116 may be planarized such that the top of the second conductive material 116 may be aligned with the top of the first dielectric layer 110. The planarization may remove the portion of the second conductive material 116 that was disposed over the first dielectric layer 110. The planarization may comprise a CMP process.

Figure 12:
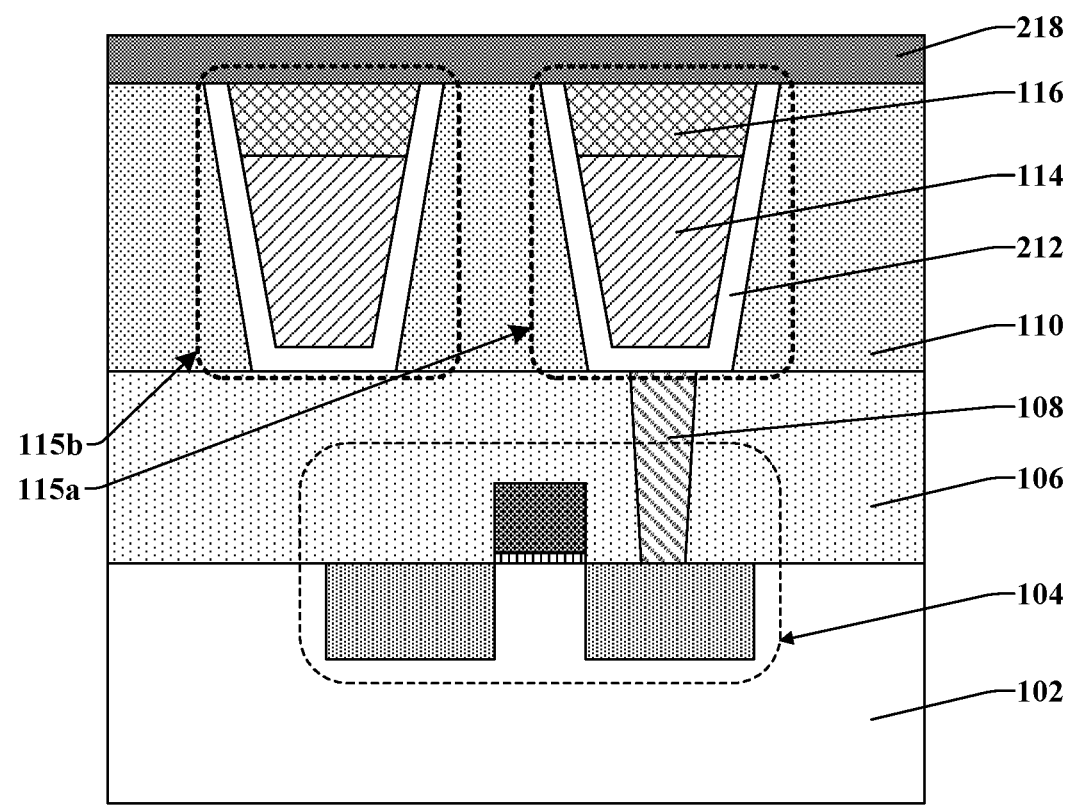

As shown in cross-sectional view 1200 of FIG. 12, an etch stop layer 218 may be formed over the top of the second conductive material 116 and over the top of the first dielectric layer 110. The etch stop layer 218 may be formed by CVD, ALD, or the like.

Figure 13:
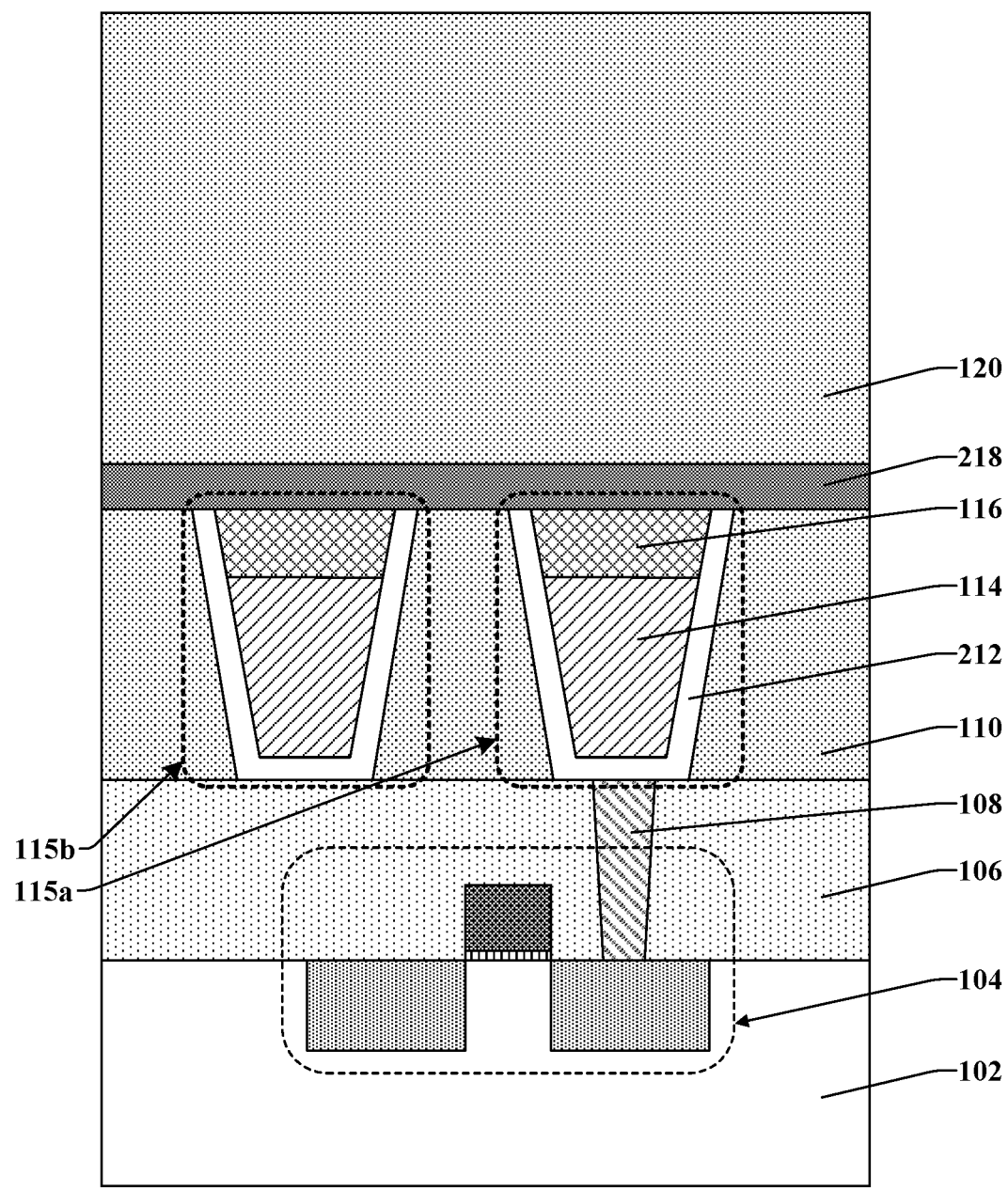

As shown in cross-sectional view 1300 of FIG. 13, the second dielectric layer 120 may be formed over the etch stop layer 218. The second dielectric layer 120 may be formed by CVD, ALD, or the like.

Figure 14:
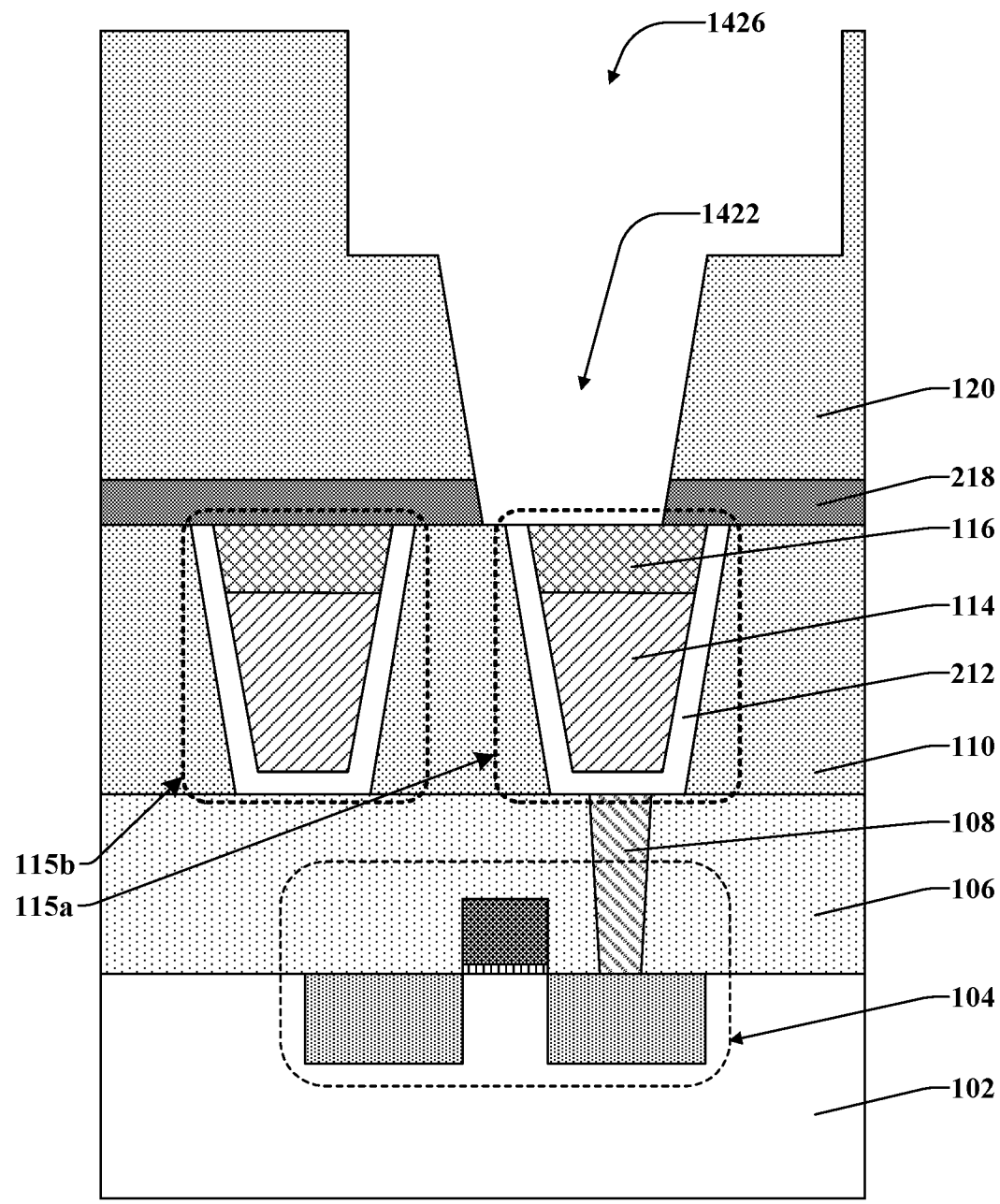

As shown in cross-sectional view 1400 of FIG. 14, a third etch may be performed into the second dielectric layer 120 and into the etch stop layer 218 to form a first via opening 1422. The third etch may comprise a wet etching process or a dry etching process. The first via opening 1422 may comprise vertical sidewalls or angled sidewalls. In addition, a fourth etch may be performed into the second dielectric layer 120 to form a third trench opening 1426. The fourth etch may comprise a wet etching process or a dry etching process. The third trench opening 1426 may comprise vertical sidewalls or angled sidewalls.

Figure 15A:
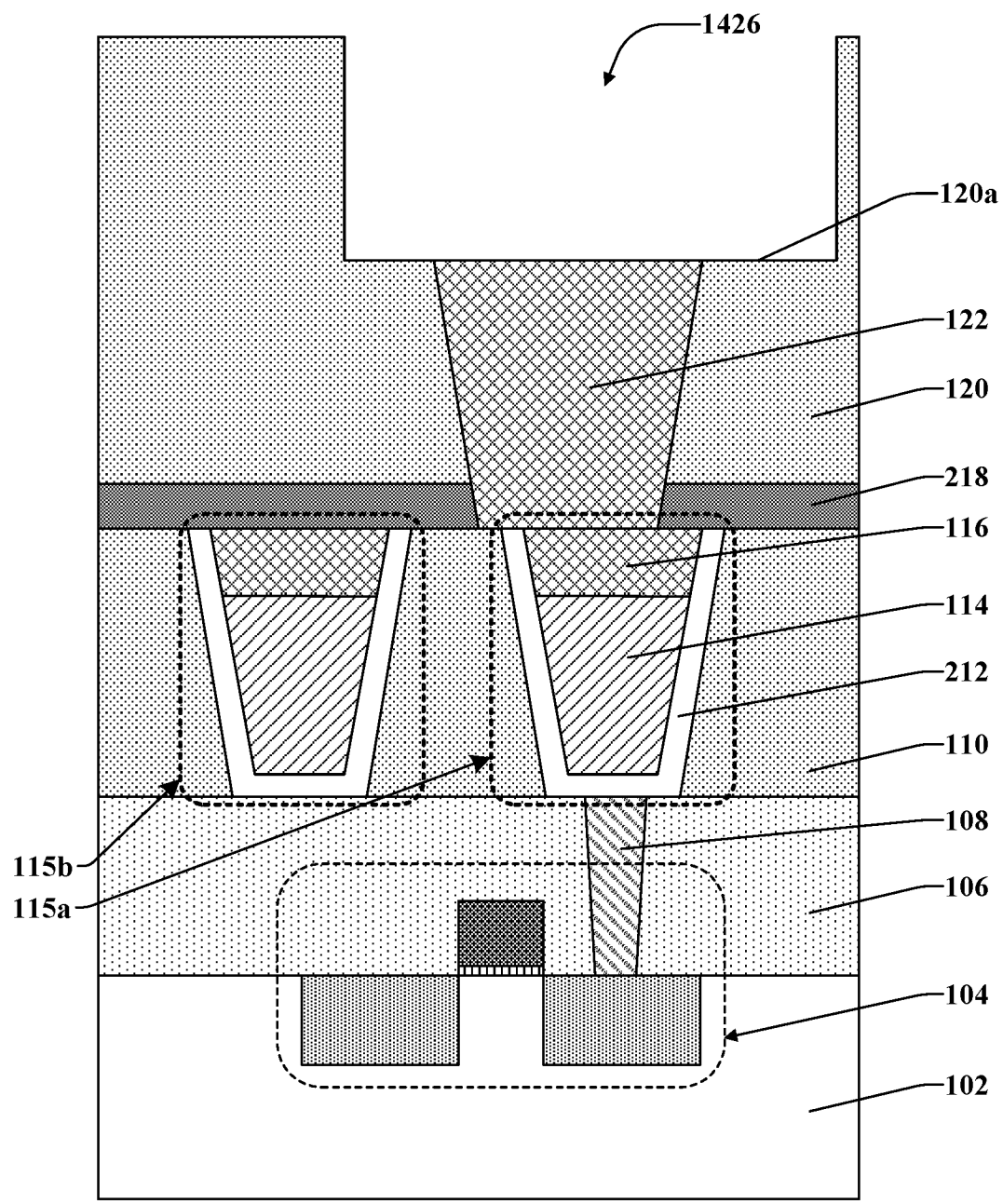
Figure 15B:
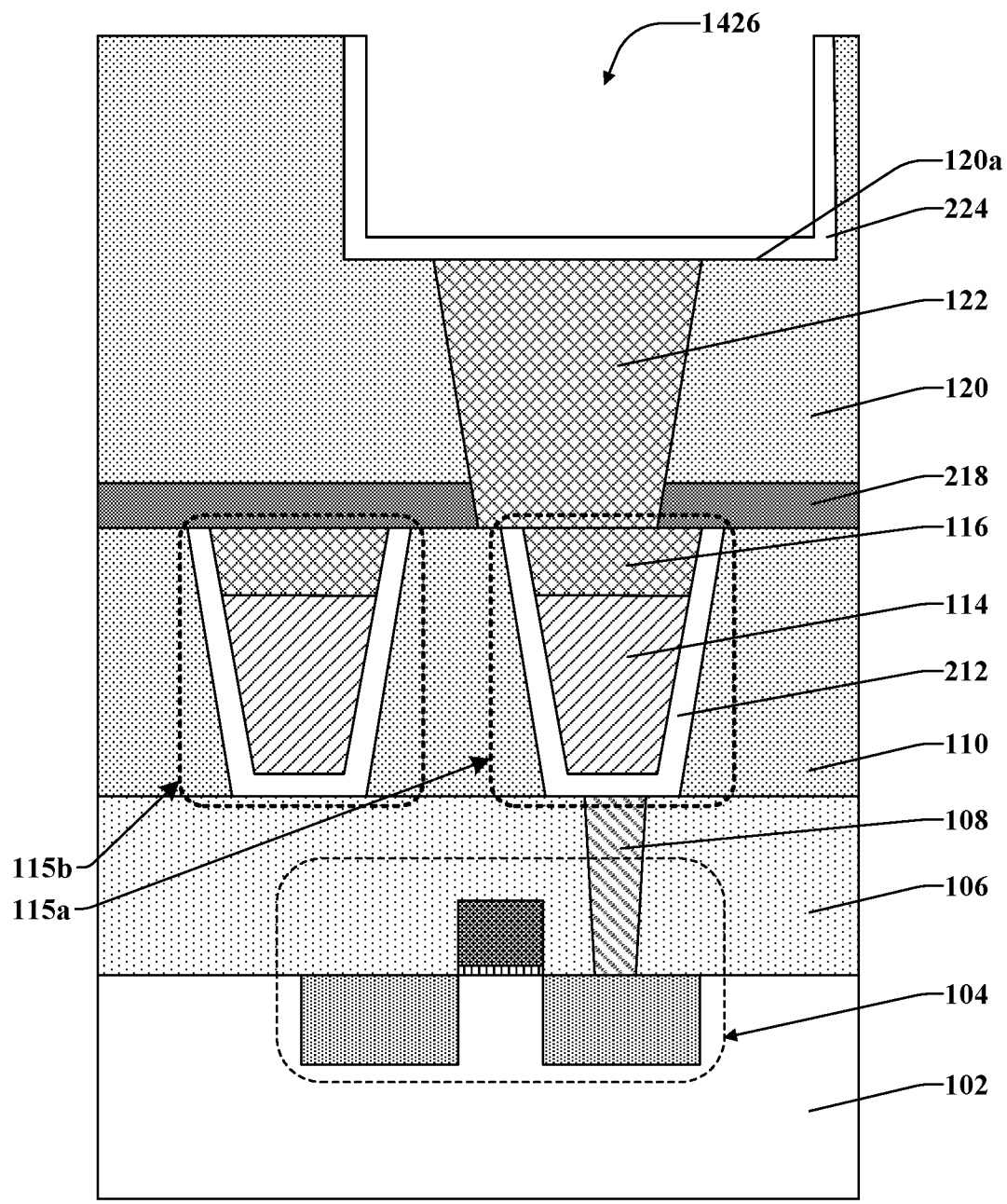
Figure 15C:
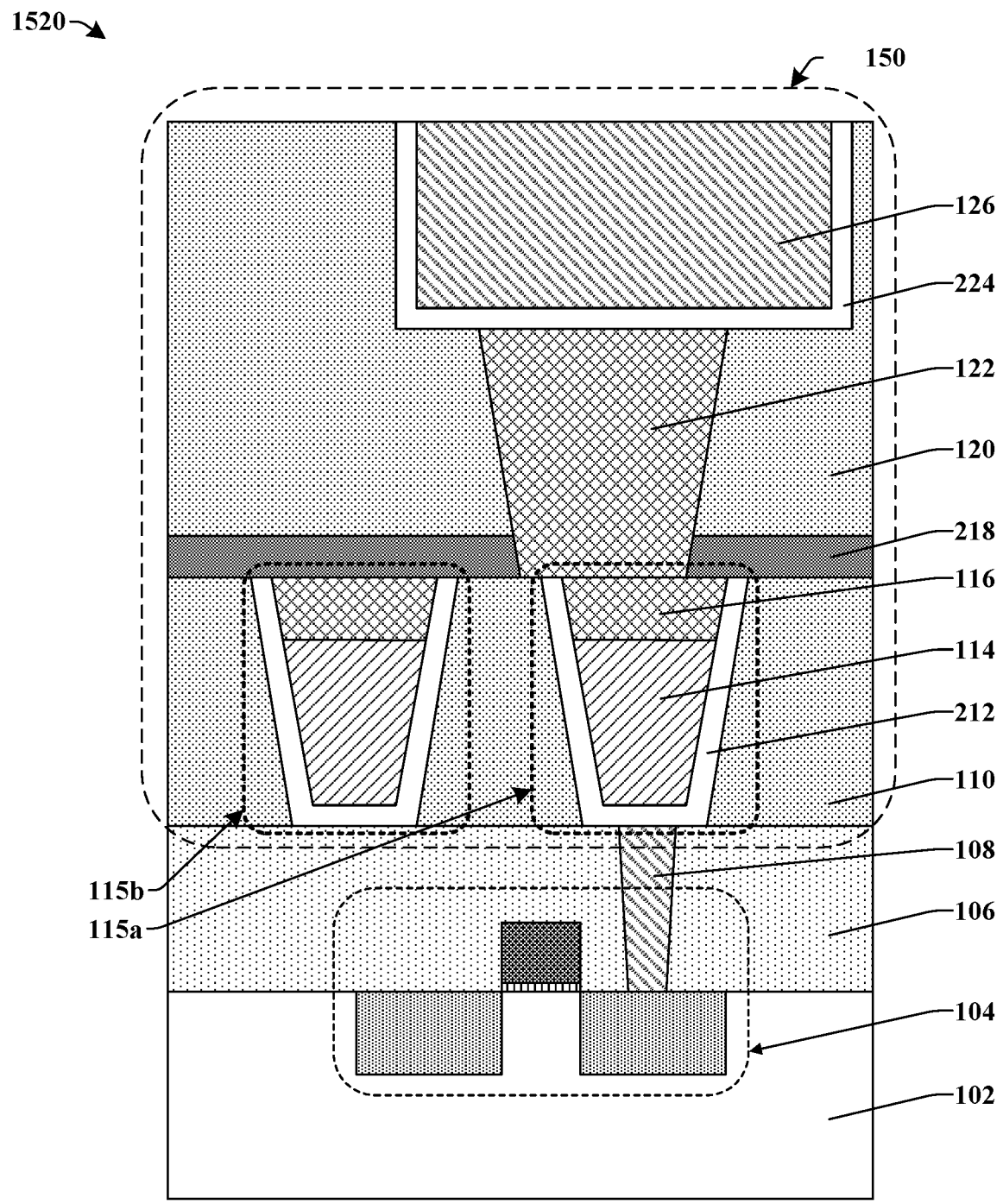

Cross sectional views 1500-1520 of FIGS. 15A-15C illustrate cross-sectional views of a first embodiment for performing a remainder of the method.

As shown in cross-sectional view 1500 of FIG. 15A, the first via 122 may be formed in the first via opening (1422 of FIG. 14). The first via 122 may be formed along sidewalls of the second dielectric layer 120 that define the via opening (1422 of FIG. 14). The first via 122 may be formed such that the top of the first via 122 may be flat or uneven and may be above or below an upper surface 120a of the second dielectric layer 120 defined by the third trench opening 1426.

In some embodiments, the first via 122 may be formed by depositing the second conductive material into the via opening (1422 of FIG. 14) by way of a deposition process (e.g., CVD, ALD, etc.). In some such embodiments, the second conductive material may subsequently be etched back. After the etch back, a remaining thickness of the second conductive material may be in a range of between approximately 50 angstroms and approximately 500 angstroms. In some embodiments, etching back the second conductive material may confine the second conductive material to within the via opening (1422 of FIG. 14). In other embodiments, etching back the second conductive material may leave a part of the second conductive material over the upper surface 120a of the second dielectric layer 120. In other embodiments, the second conductive material may be formed into the via opening (1422 of FIG. 14) by way of an ELD process. In some embodiments, the second conductive material may have a curved upper surface. In various embodiments, the curved upper surface may be above or below the upper surface 120a.

As shown in cross-sectional view 1510 of FIG. 15B, the second barrier layer 224 is formed over the first via 122, over the upper surface 120a of second dielectric layer 120, and in the third trench opening 1426 along sidewalls of the second dielectric layer 120. The second barrier layer 224 may be formed by CVD, ALD, or the like.

As shown in cross-sectional view 1520 of FIG. 15C, the third metal line 126 comprising the first conductive material may be formed over the second barrier layer 224 and in the third trench opening (1426 of FIG. 15B). Forming the third metal line 126 may comprise depositing a first conductive material into the third trench opening (1426 of FIG. 15B) by way of a deposition process (e.g., CVD, ALD, etc.) or by way of a plating process (e.g., ELD, ECP, etc.). In some embodiments, a planarization process may be performed on the first conductive material after the deposition process.

Figure 16A:
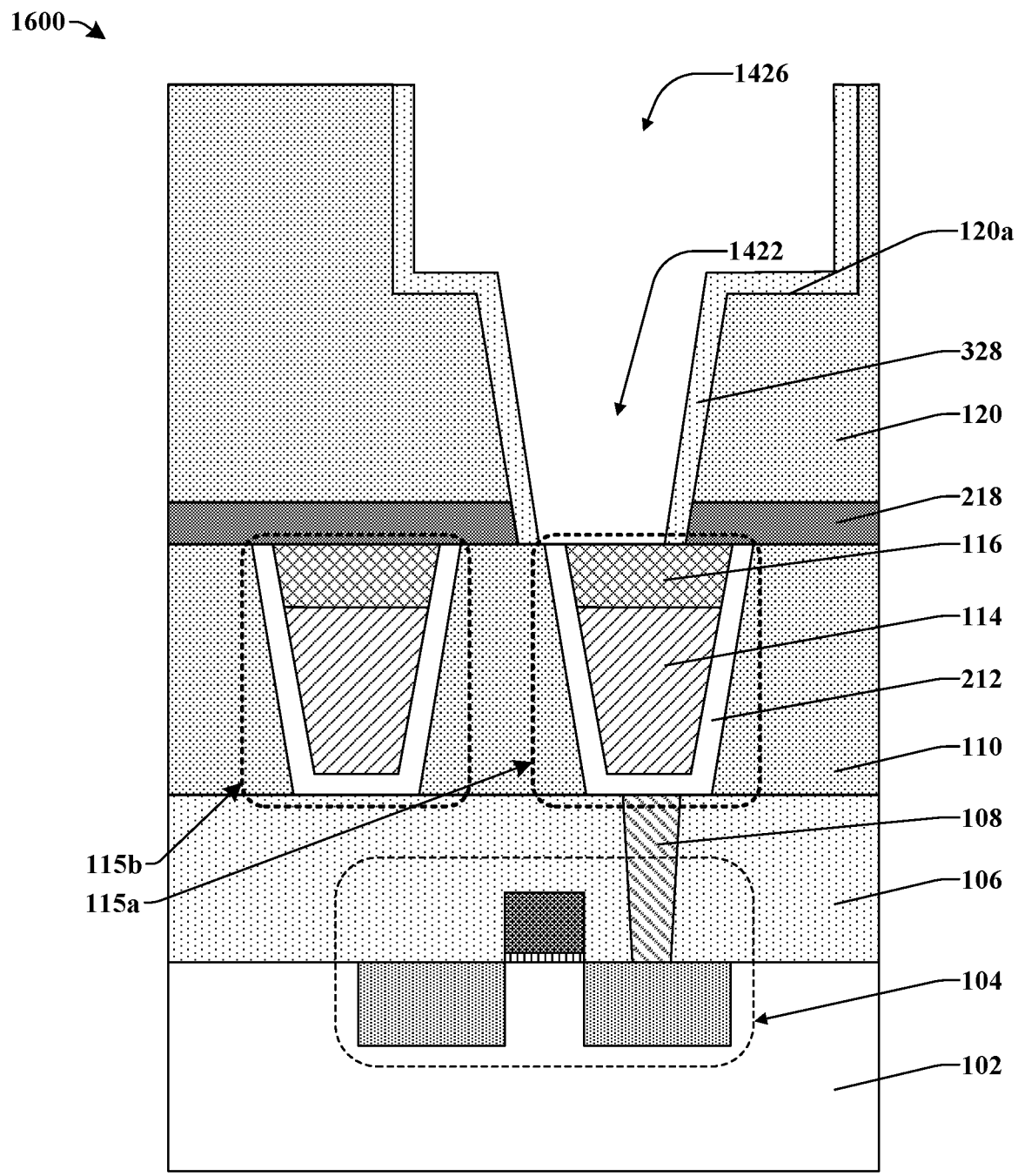
Figure 16B:
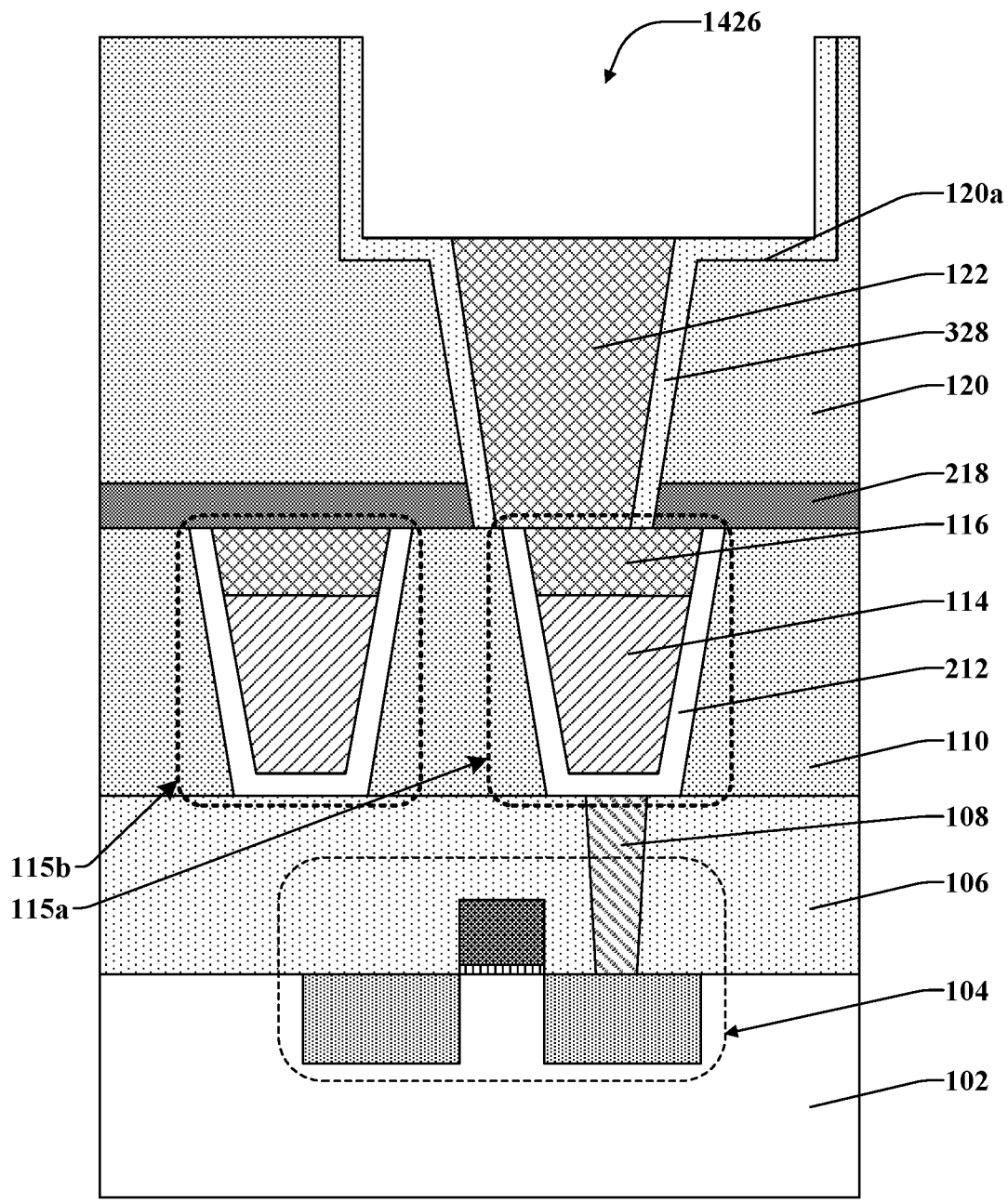
Figure 16C:
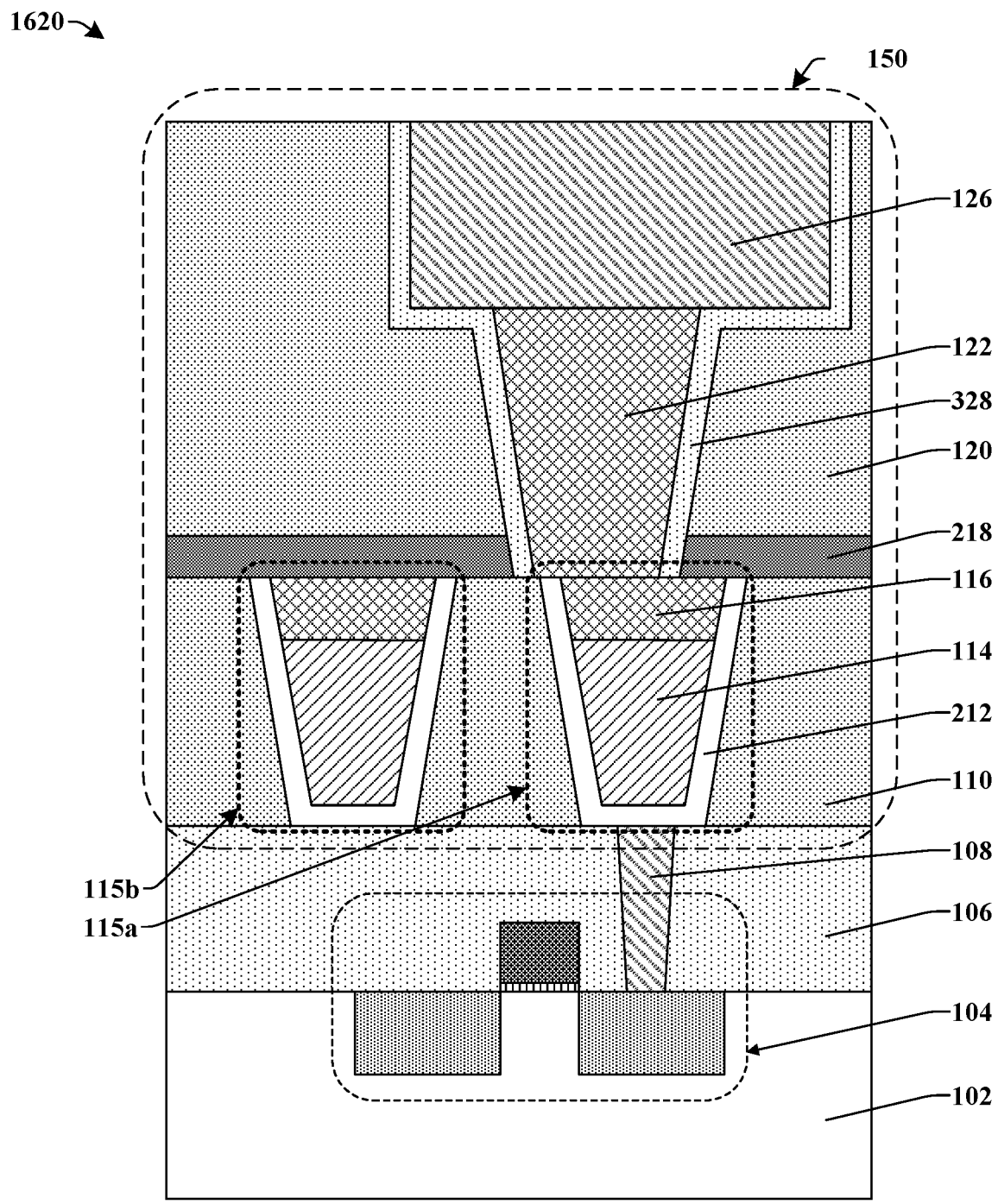

Cross sectional views 1600-1620 of FIGS. 16A-16C illustrate cross-sectional views of a second embodiment for performing the remainder of the method.

As shown in cross-sectional view 1600 of FIG. 16A, a second barrier layer 328 may be formed in the via opening 1422 and in the third trench opening 1426. The second barrier layer 328 may be formed along the sidewalls of the second dielectric layer 120 that define the via opening 1422, along the sidewalls of the second dielectric layer 120 that define the third trench opening 1426, and along the upper surface 120a of the second dielectric layer 120 defined by the third trench opening 1426. The second barrier layer 328 may be formed such that the second barrier layer 328 does not cover a top of the first metal line 115a by way of a selective ALD or selective CVD process.

As shown in cross-sectional view 1610 of FIG. 16B, a first via 122 comprising the second conductive material may be formed in the via opening (1422 of FIG. 16A). The first via 122 may be formed along sidewalls of the second barrier layer 328. The first via 122 may be formed such that the top of the first via 122 may be flat or uneven and may be above or below the upper surface 120a of the second dielectric layer 120 defined by the third trench opening 1426. The first via 122 may be formed by depositing the second conductive material in the via opening (1422 of FIG. 16A) by way of CVD, ALD, ELD, or the like.

As shown in cross-sectional view 1620 of FIG. 16C, the third metal line 126 comprising the first conductive material may be formed over the first via 122 and in the third trench opening (1426 of FIG. 16A). The third metal line 126 may be formed over an upper surface of the second barrier layer 328 and along sidewalls of the second barrier layer 328. The third metal line 126 may be formed by depositing the first conductive material in the third trench opening (1426 of FIG. 16B) by way of CVD or ALD followed by a planarization process (e.g., a CMP process).

Figure 17:
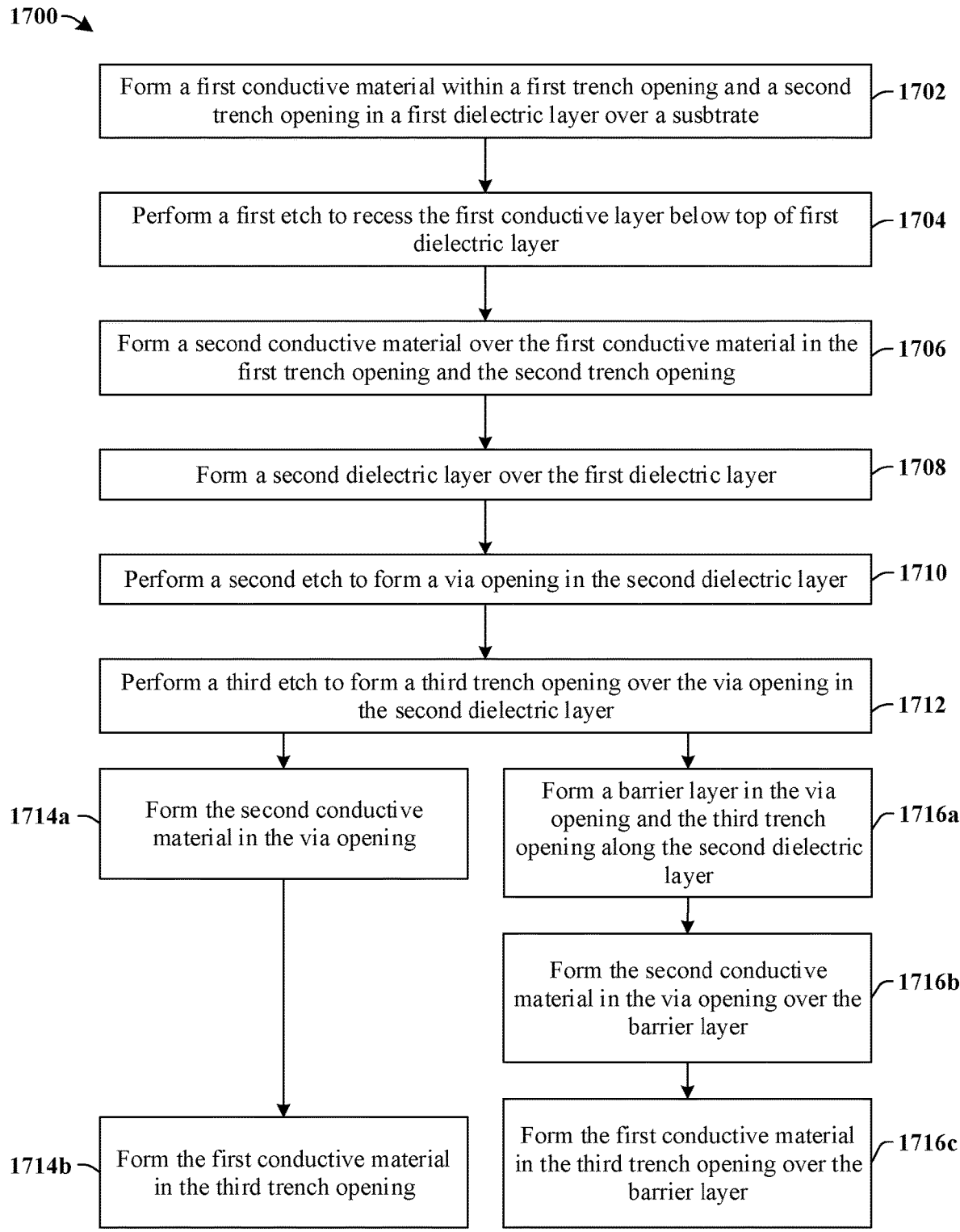
FIG. 17 illustrates a flow diagram of some embodiments of a method for forming an integrated chip comprising a hybrid interconnect structure.

FIG. 17 illustrates a flow diagram of some embodiments of a method 1700 for forming an integrated chip comprising a hybrid interconnect structure.

While method 1700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1702, a first conductive material is formed within a first trench opening and a second trench opening in a first dielectric layer over a substrate. FIG. 7 illustrates a cross-sectional view 700 of some embodiments corresponding to act 1702.

At 1704, a first etch is performed to recess the first conductive material below a top of the first dielectric layer. FIG. 9 illustrates a cross-sectional view 900 of some embodiments corresponding to act 1704.

At 1706, a second conductive material is formed over the first conductive material in the first trench opening and the second trench opening. FIG. 10 illustrates a cross-sectional view 1000 of some embodiments corresponding to act 1706.

At 1708, a second dielectric layer is formed over the first dielectric layer. FIG. 13 illustrates a cross-sectional view 1300 of some embodiments corresponding to act 1708.

At 1710, a second etch is performed to form a via opening in the second dielectric layer such that the via opening extends through the second dielectric layer to the second conductive material. FIG. 14 illustrates a cross-sectional view 1400 of some embodiments corresponding to act 1710.

At 1712, a third etch is performed to form a third trench opening over the via opening and in the second dielectric layer. FIG. 14 illustrates a cross-sectional view 1400 of some embodiments corresponding to act 1712.

At 1714a and 1714b, a first embodiment for performing a remainder of the method is shown.

At 1714a, the second conductive material is formed in the via opening. FIG. 15A illustrates a cross-sectional view 1500 of some embodiments corresponding to act 1714a.

At 1714b, the first conductive material is formed in the third trench opening. FIG. 15C illustrates a cross-sectional view 1520 of some embodiments corresponding to act 1714b.

At 1716a-1716c, a second embodiment for performing the remainder of the method is shown.

At 1716a, a barrier layer is formed in the via opening and the third trench opening. FIG. 16A illustrates a cross-sectional view 1600 of some embodiments corresponding to act 1716a.

At 1716b, the second conductive material is formed in the via opening. FIG. 16B illustrates a cross-sectional view 1610 of some embodiments corresponding to act 1716b.

At 1716c, the first conductive material is formed in the third trench opening. FIG. 16C illustrates a cross-sectional view 1620 of some embodiments corresponding to act 1716c.

Accordingly, in some embodiments, the present disclosure relates to an integrated chip comprising a hybrid interconnect structure for improving the reliability of the integrated chip and a method for forming the hybrid interconnect structure.

In some embodiments, the present disclosure relates to an interconnect structure. The interconnect structure includes a first metal line comprising a first conductive material disposed within a first dielectric layer over a substrate. A second conductive material is disposed within the first dielectric layer and directly over a top of the first conductive material. The second conductive material is different from the first conductive material. A second dielectric layer is disposed over the first dielectric layer. A first via comprises a third conductive material disposed within the second dielectric layer and on a top of the second conductive material. The second conductive material and the third conductive material have lower diffusion coefficients than the first conductive material.

In other embodiments, the present disclosure relates to an interconnect structure. The interconnect structure includes a first metal line comprising a first metal and a second metal over a topmost surface of the first metal. The second metal is different from the first metal. A first dielectric layer laterally surrounds the first metal line. A first via comprising the second metal is over the first metal line. A second metal line is over the first via. A second dielectric layer laterally surrounds the first via and the second metal line. The second dielectric layer is vertically separated from the first dielectric layer by an etch stop layer.

In yet other embodiments, the present disclosure relates to a method for forming an interconnect structure. A first conductive material comprising a first metal is formed within a first trench opening defined by sidewalls of a first dielectric layer. The first conductive material is recessed below a top of the first dielectric layer. A second conductive material comprising a second metal is formed within the first trench opening and over the first conductive material. A second dielectric layer is formed over the first dielectric layer. A via opening is formed in the second dielectric layer. The via opening extends through the second dielectric layer to an upper surface of the second conductive material. The second conductive material is formed in the via opening. The first conductive material is formed in a second trench opening over the via opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
a substrate;
a first dielectric layer over the substrate;
a first conductive material between a pair of sidewalls of the first dielectric layer;
a second conductive material, different than the first conductive material, between the pair of sidewalls of the first dielectric layer and over the first conductive material, wherein the second conductive material comprises a first metal;
a second dielectric layer over the first dielectric layer;
a third conductive material, different than the first conductive material, between a pair of sidewalls of the second dielectric layer and over the second conductive material, wherein the third conductive material comprises the first metal, and wherein the second conductive material extends from the first conductive material to the third conductive material; and
a fourth conductive material, different than the third conductive material, over the third conductive material.

2. The integrated chip of claim 1, wherein the first conductive material comprises a second metal, different than the first metal.

3. The integrated chip of claim 2, where the fourth conductive material comprises the second metal.

4. The integrated chip of claim 1, wherein the second conductive material is directly over the first conductive material, the third conductive material is directly over the second conductive material, and the fourth conductive material is directly over the third conductive material.

5. The integrated chip of claim 1, wherein a bottommost surface of the second conductive material is directly over a topmost surface of the first conductive material, and wherein the first conductive material and the second conductive material are directly between the pair of sidewalls of the first dielectric layer.

6. The integrated chip of claim 1, wherein the first conductive material and the second conductive material form a first metal line, wherein the third conductive material forms a metal via over and coupled to the first metal line, and wherein the fourth conductive material forms a second metal line over and coupled to the metal via.

7. The integrated chip of claim 6, wherein a first sidewall of the metal via is directly over the first metal line, and wherein a second sidewall of the metal via is laterally offset from the first metal line.

8. The integrated chip of claim 1, further comprising:
a barrier layer on sidewalls of the third conductive material and sidewalls of the fourth conductive material, wherein the third conductive material directly contacts the second conductive material.

9. An integrated chip comprising:
a first metal line comprising a first metal and a second metal, different than the first metal, overlying the first metal;
a first dielectric layer on opposite sides of the first metal line;
a metal via overlying the first metal line, the metal via comprising a third metal, different than the first metal;
a second dielectric layer on opposite sides of the metal via; and
a second metal line overlying the metal via, the second metal line comprising a fourth metal, different than the third metal.

10. The integrated chip of claim 9, further comprising:
a third metal line laterally spaced from the first metal line, wherein the first dielectric layer is directly between the first metal line and the third metal line, wherein a distance between the third metal line and the first metal of the first metal line is greater than a distance between the third metal line and the second metal of the first metal line.

11. The integrated chip of claim 10, wherein a distance between the third metal line and the third metal of the metal via is less than the distance between the third metal line and the second metal of the first metal line.

12. The integrated chip of claim 9, wherein the fourth metal is different than the second metal.

13. The integrated chip of claim 9, wherein a bottommost surface of the second metal is over a topmost surface of the first metal, and wherein the first metal and the second metal are directly between a pair of sidewalls of the first dielectric layer.

14. The integrated chip of claim 9, further comprising:
a barrier layer on sidewalls of the metal via and sidewalls of the second metal line, wherein the metal via is on a top surface of the first metal line.

15. The integrated chip of claim 9, wherein the second metal and the third metal have higher resistivities to diffusion than the first metal and the fourth metal.

16. An integrated chip comprising:
a first dielectric layer over a substrate;
a first metal line within the first dielectric layer, the first metal line comprising a first metal and a second metal, different than the first metal, over the first metal;
a second metal line within the first dielectric layer and laterally spaced from the first metal line, the second metal line comprising a third metal and a fourth metal, different than the third metal, over the third metal;
a metal via over the first metal line, the metal via comprising a fifth metal, different than the first metal; and
a third metal line over the metal via, the third metal line comprising a sixth metal, different than the fifth metal,
wherein a distance between the first metal and the third metal is greater than a distance between the second metal and the fourth metal.

17. The integrated chip of claim 16, wherein the distance between the first metal and the third metal is greater than a distance between the fourth metal and the fifth metal.

18. The integrated chip of claim 16, wherein the distance between the second metal and the fourth metal is greater than a distance between the fifth metal and the fourth metal.

19. The integrated chip of claim 16, wherein a sidewall of the first metal line faces the second metal line, wherein a sidewall of the second metal line faces the first metal line, and wherein a sidewall of the metal via is over and between the sidewall of the first metal line and the sidewall of the second metal line.

20. The integrated chip of claim 16, wherein a bottommost surface of the second metal is on a topmost surface of the first metal, and wherein the first metal and the second metal are directly between a pair of sidewalls of the first dielectric layer.

* * * * *